United States Patent
Qamar et al.

(10) Patent No.: US 10,996,081 B2
(45) Date of Patent: May 4, 2021

(54) INTEGRATED OPTICAL/ELECTRICAL PROBE CARD FOR TESTING OPTICAL, ELECTRICAL, AND OPTOELECTRONIC DEVICES IN A SEMICONDUCTOR DIE

(71) Applicant: Newport Fab, LLC, Newport Beach, CA (US)

(72) Inventors: Yasir Qamar, Corona, CA (US); Edward Preisler, San Clemente, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/570,926

(22) Filed: Sep. 13, 2019

(65) Prior Publication Data

US 2021/0080295 A1 Mar. 18, 2021

(51) Int. Cl.
| | |
|---|---|
| *G01N 21/00* | (2006.01) |
| *G01D 5/56* | (2006.01) |
| *G01R 1/067* | (2006.01) |
| *G01R 1/073* | (2006.01) |
| *G01M 11/00* | (2006.01) |
| *G01D 5/26* | (2006.01) |
| *G02B 6/42* | (2006.01) |
| *G01R 1/07* | (2006.01) |

(52) U.S. Cl.
CPC ............ *G01D 5/56* (2013.01); *G01D 5/268* (2013.01); *G01M 11/30* (2013.01); *G01R 1/0675* (2013.01); *G01R 1/07* (2013.01); *G01R 1/07342* (2013.01); *G02B 6/4246* (2013.01)

(58) Field of Classification Search
CPC ... H01J 37/32935; G01N 21/64; G01N 21/68; G01N 2015/1037; G01J 3/02
USPC .......................................................... 356/72
See application file for complete search history.

(56) References Cited

U.S. PATENT DOCUMENTS

| | | | |
|---|---|---|---|
| 7,024,066 B1 * | 4/2006 | Malendevich | G02B 6/122 356/614 |
| 2003/0218119 A1 * | 11/2003 | Stegmuller | H01S 5/06256 250/214.1 |
| 2004/0017215 A1 * | 1/2004 | Mule | G01R 31/311 324/754.06 |
| 2007/0132467 A1 * | 6/2007 | Jager | G01R 31/311 324/754.07 |

\* cited by examiner

*Primary Examiner* — Md M Rahman
(74) *Attorney, Agent, or Firm* — Farjami & Farjami LLP

(57) ABSTRACT

A test system includes a semiconductor die and an integrated optical/electrical probe card. Electrical, optical, and optoelectronic devices reside in the semiconductor die. Electrical pads in the semiconductor die connect to the electrical and optoelectronic devices. Grating couplers in the semiconductor die connect to the optical device and optoelectronic devices. The electrical pads and grating couplers are interspersed in substantially a single line in the semiconductor die. The integrated optical/electrical probe card interfaces with the electrical pads by electrical needles, and concurrently interfaces with the grating couplers by optical fibers.

20 Claims, 5 Drawing Sheets

US 10,996,081 B2

1

INTEGRATED OPTICAL/ELECTRICAL PROBE CARD FOR TESTING OPTICAL, ELECTRICAL, AND OPTOELECTRONIC DEVICES IN A SEMICONDUCTOR DIE

BACKGROUND

Optical semiconductor devices have optical inputs/outputs that utilize interfaces different from electrical inputs/outputs of electrical devices. In one approach, a photonic waveguide of an optical semiconductor device can interface by end-fire coupling with an optical fiber situated on the side of a semiconductor die. This approach requires a singulated die, and thus, is not available when testing optical/optoelectronic devices at wafer-level.

In another approach, an optical fiber situated over the top of the semiconductor die can interface with a photonic waveguide of an optical semiconductor device by constructive diffraction using a grating coupler. Since the optical fiber is situated over the semiconductor die, this approach is suitable for wafer-level testing. An optical probe card containing multiple optical fibers can be used to interface with and test optical devices on the semiconductor die.

Difficulties arise when testing optoelectronic semiconductor devices having both optical and electrical inputs/outputs, and when testing optical semiconductor devices and electrical semiconductor devices on the same die. In one approach, an optical probe card can interface with optical input/outputs and an electrical probe card can interface with electrical inputs/outputs. However, using multiple probe cards increases the complexity of a test system. Aligning both the electrical probe card and the optical probe card typically requires an additional alignment step and additional alignment equipment. The electrical probe card and the optical probe card must avoid crossing and crashing into each other. Further, requiring the semiconductor die to concurrently interface with both the electrical probe card and the optical probe card complicates design of the semiconductor die and the arrangement of its input/output pads and causes layout and routing complexity, and results in functionality problems such as electrical or optical losses.

Thus, there is need in the art for a system for wafer-level testing of semiconductor dies having electrical, optical, and optoelectronic devices that overcomes the problems associated with the use and alignment of different probe cards, and that reduces significant constraints on the design and functionality of semiconductor dies.

SUMMARY

The present disclosure is directed to an integrated optical/electrical probe card for testing optical, electrical, and optoelectronic devices in a semiconductor die, substantially as shown in and/or described in connection with at least one of the figures, and as set forth in the claims.

2

Figure 3A:
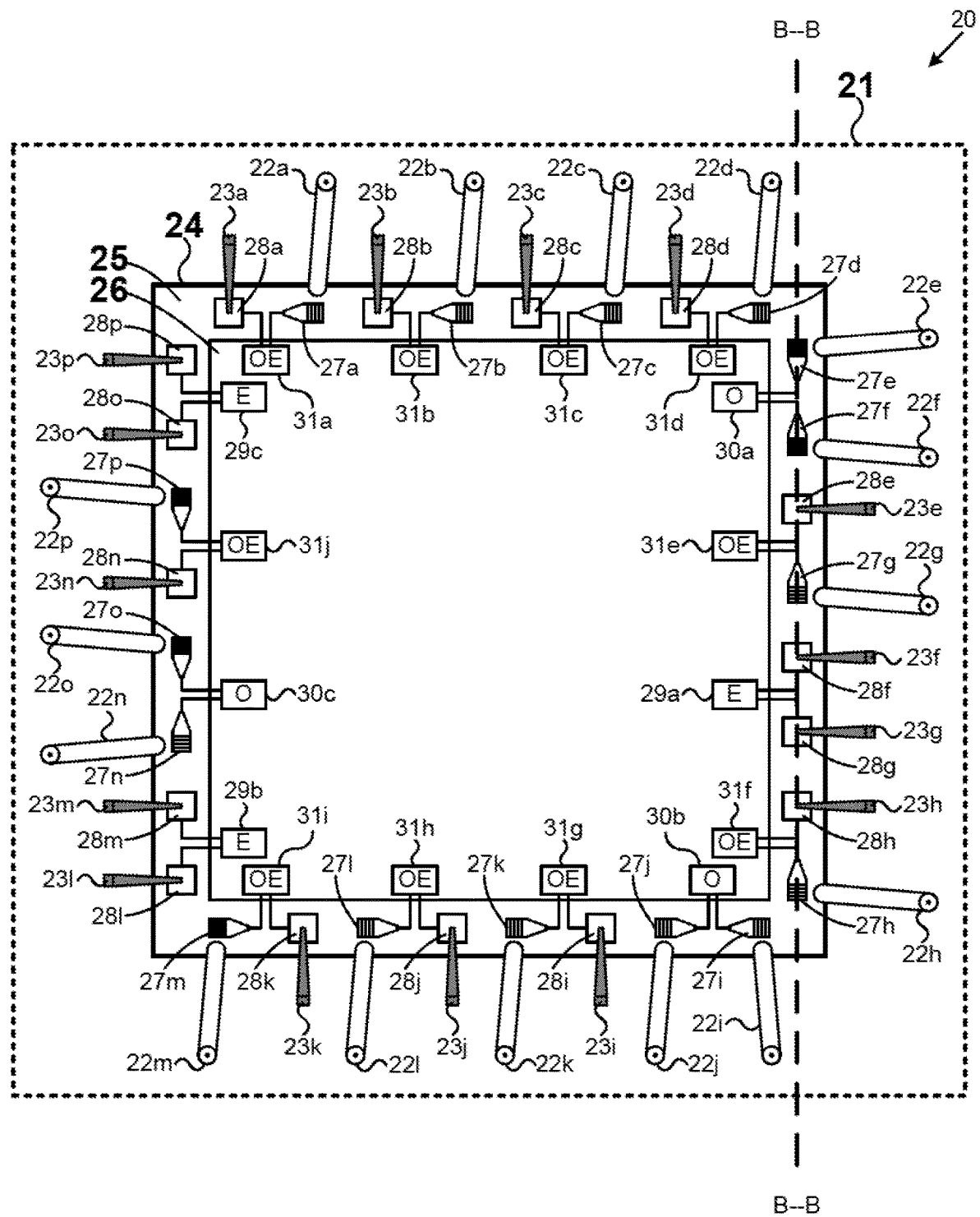
FIG. 3A illustrates a portion of a test system for optical, electrical, and optoelectronic devices according to one implementation of the present application.
Figure 3B:
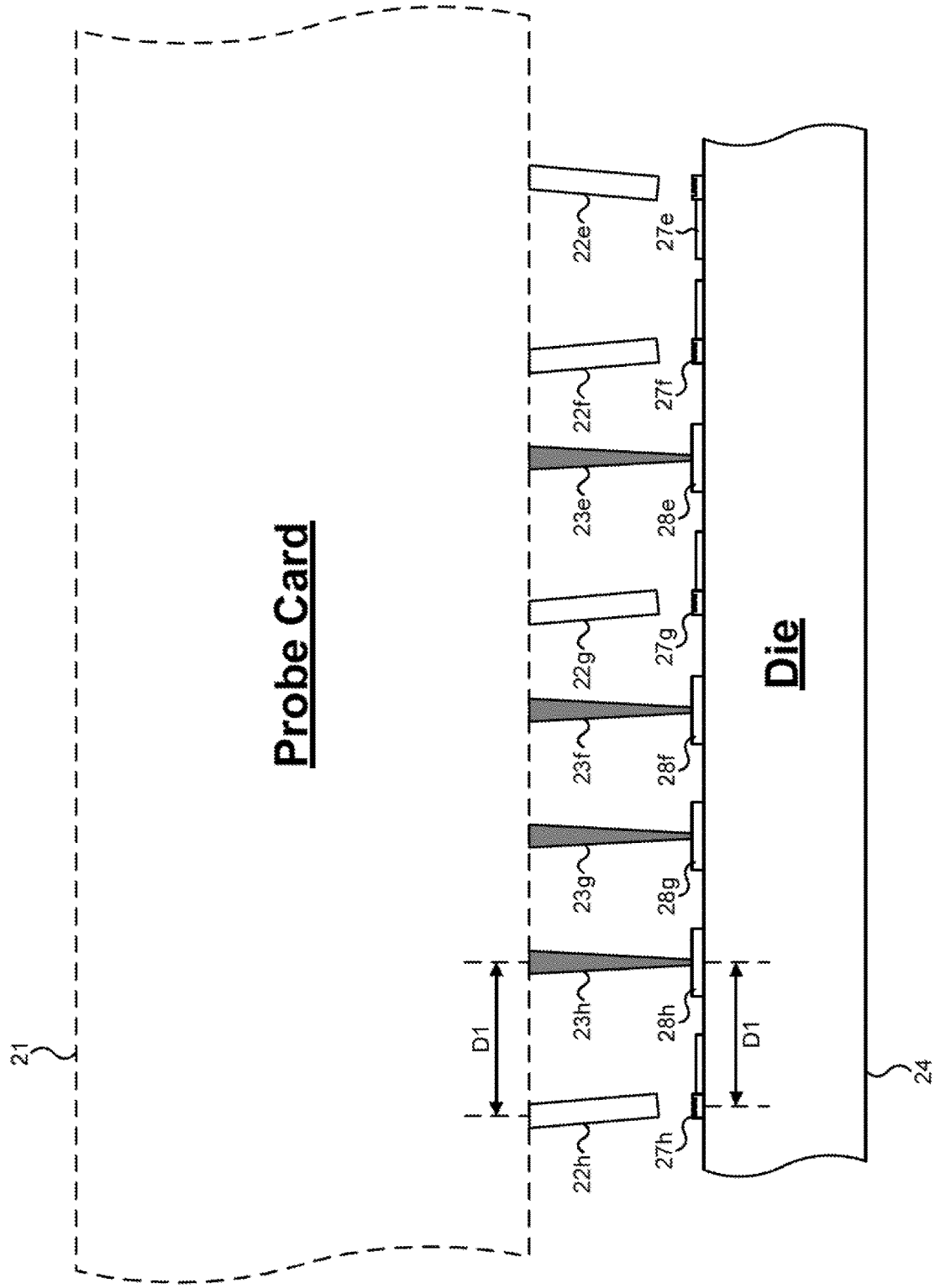

FIG. 3B illustrates a cross-sectional view of a portion of a test system for optical, electrical, and optoelectronic devices according to one implementation of the present application.

Figure 3C:
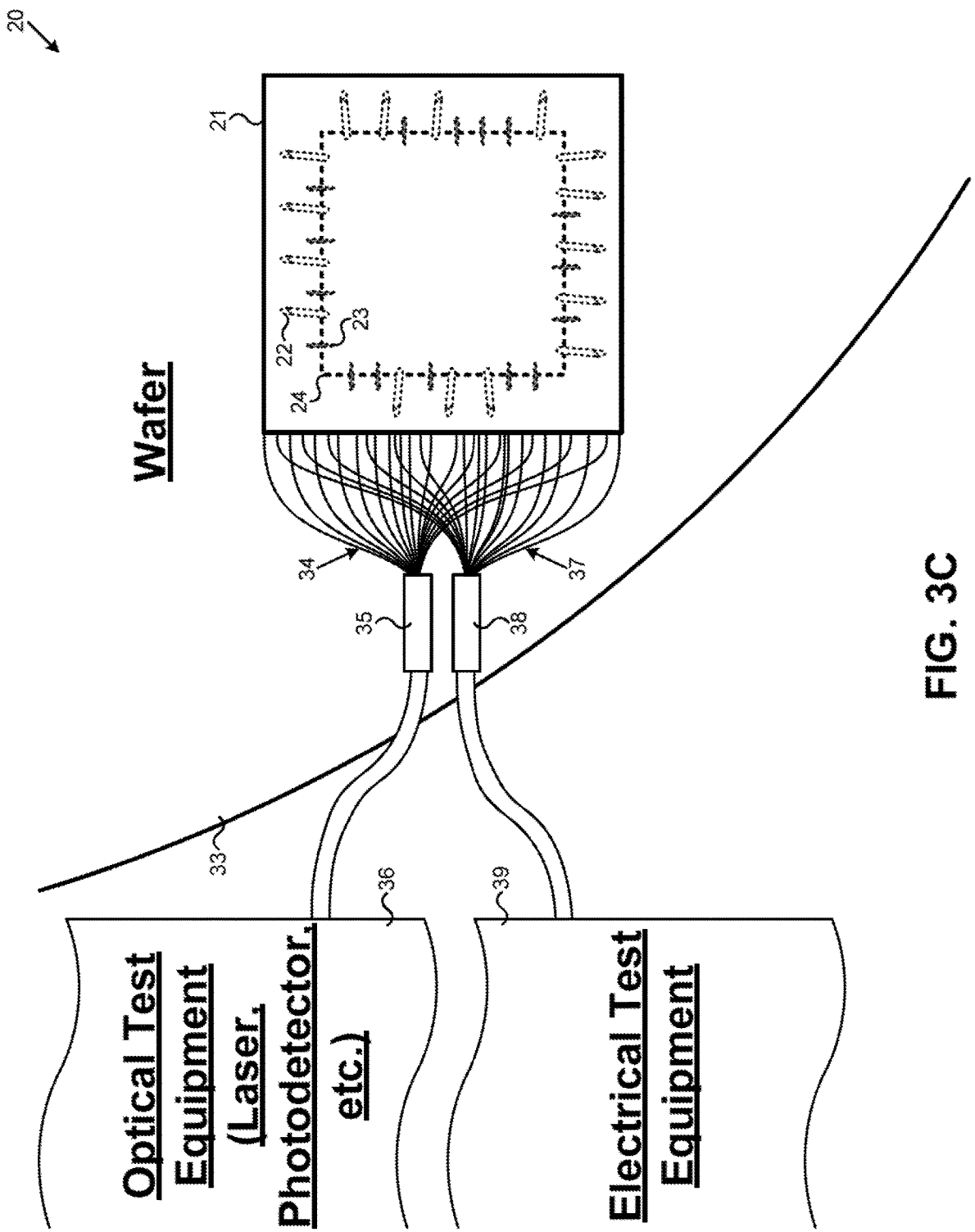

FIG. 3C illustrates a test system for optical, electrical, and optoelectronic devices according to one implementation of the present application.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
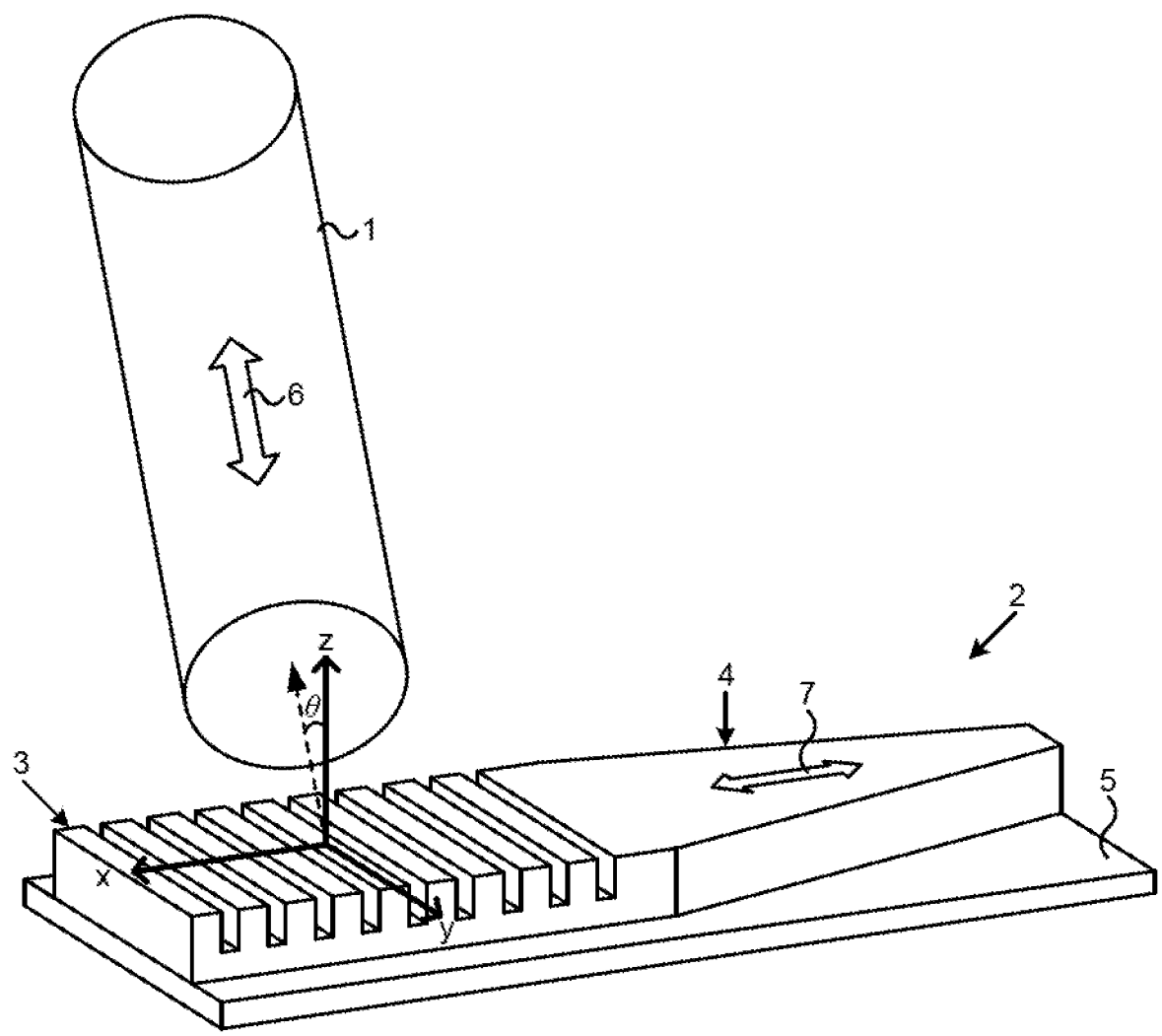
FIG. 1 illustrates a perspective view of a portion of an optical interface according to one implementation of the present application.

FIG. 1 illustrates a perspective view of a portion of an optical interface according to one implementation of the present application. The optical interface includes optical fiber 1 and grating coupler 2. Grating coupler 2 includes gratings 3 and tapered waveguide 4. Grating coupler 2 is situated on semiconductor die 5. In one implementation, grating coupler 2 comprises silicon. Semiconductor die 5 may include other components not shown in FIG. 1.

Optical fiber 1 transmits light to grating coupler 2. Optical fiber 1 can be coupled to a tunable laser in an optical test equipment (not shown in FIG. 1), or to another light source. Optical fiber 1 transmits light along path 6. In the present implementation, optical fiber 1 is a single mode fiber. In various implementations, optical fiber 1 may be a multi-mode fiber, or any other type of optical fiber.

Grating coupler 2 couples light from optical fiber 1 into a different plane, such that the light can be routed to an optical or optoelectrical device (not shown in FIG. 1) in semiconductor die 5. Gratings 3 of grating coupler 2 serve to diffract light emitted from optical fiber 1. If optical fiber 1 is angled appropriately with respect to gratings 3, the diffracted light constructively interferes in a plane parallel to the xy-plane, in the direction of tapered waveguide 4. Tapered waveguide 4 couples the diffracted light along path 7. Tapered waveguide 4 can couple to a photonic waveguide, which ultimately couples to an optical or optoelectrical device (not shown in FIG. 1) on semiconductor die 5. Thus, grating coupler 2 can provide light from optical fiber 1 to an optical or optoelectrical device on semiconductor die 5. It is noted that the optical interface in FIG. 1 is bidirectional, and grating coupler 2 can provide light received along path 7 to optical fiber 1. In other words, the optical interface in FIG. 1 can serve as an input to or an output from an optical or optoelectrical device on semiconductor die 5.

Angle θ between optical fiber 1 and the normal to gratings 3 (i.e., between optical fiber 1 and the z-axis) represents an angle required for light diffracted by gratings 3 to constructively interfere. Angle θ can depend on the dimensions, spacing, and refraction index of gratings 3, or other considerations. In various implementations, angle θ can range from approximately one degree to approximately ten degrees (1°-10°).

Figure 2:
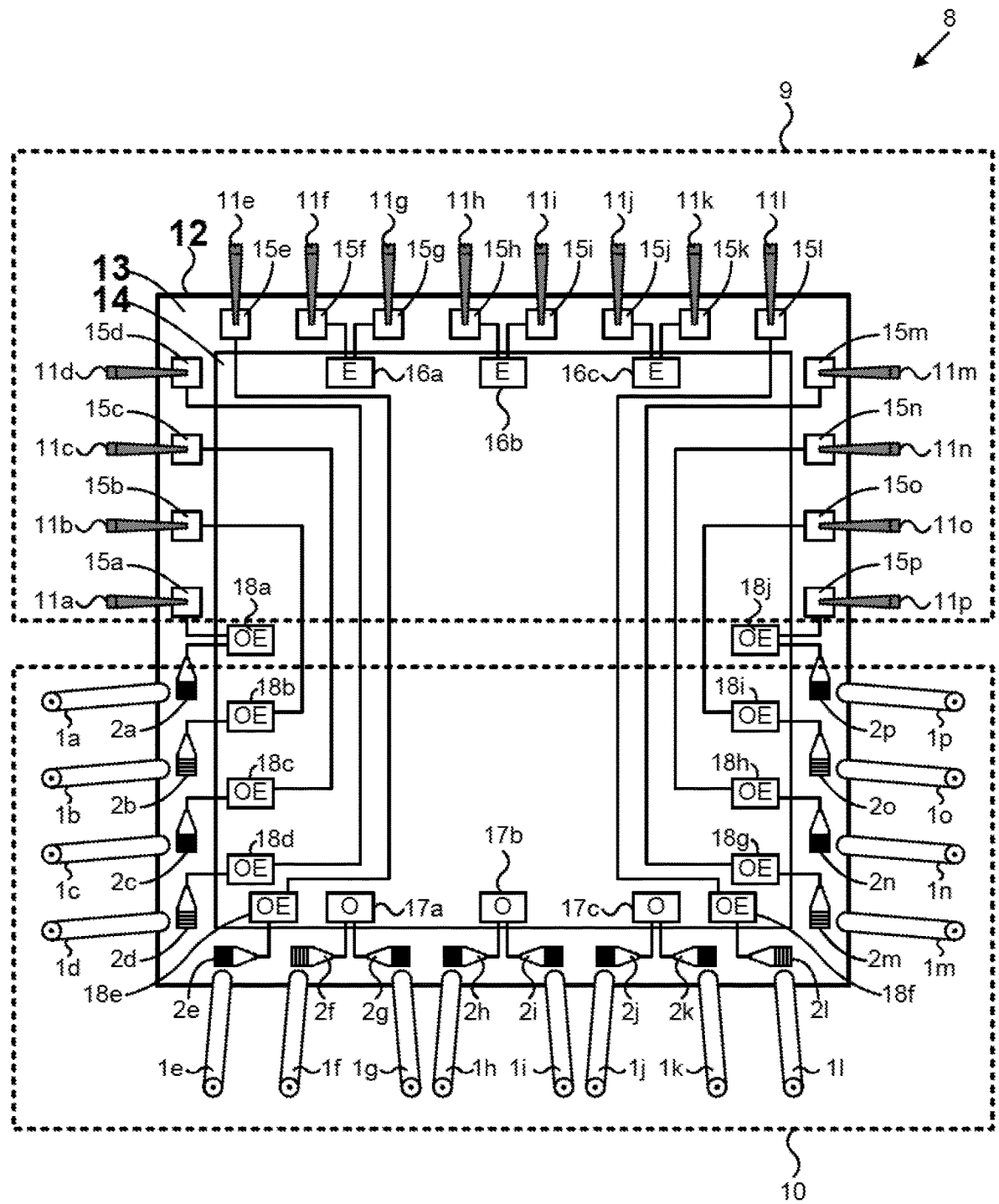
FIG. 2 illustrates a portion of a test system for optical, electrical, and optoelectronic devices.

FIG. 2 illustrates a portion of a test system for optical, electrical, and optoelectronic devices. Test system 8 includes electrical probe card 9, optical probe card 10, and semiconductor die 12. Electrical probe card 9 includes electrical needles 11a, 11b, 11c, 11d, 11e, 11f, 11g, 11h, 11i, 11j, 11k, 11*l*, 11*m*, 11*n*, 11*o*, and *p*, collectively referred to as electrical needles 11. Optical probe card 10 includes optical fibers 1*a*, 1*b*, 1*c*, 1*d*, 1*e*, 1*f*, 1*g*, 1*h*, 1*i*, 1*j*, 1*k*, 1*l*, 1*m*, 1*n*, 1*o*, and 1*p*, collectively referred to as optical fibers 1. Optical fibers 1 in FIG. 2 generally correspond to optical fiber 1 in FIG. 1, and may have any implementations and advantages described above. Semiconductor die 12 includes scribe line 13, device area 14, grating couplers 2*a*, 2*b*, 2*c*, 2*d*, 2*e*, 2*f*, 2*g*, 2*h*, 2*i*, 2*j*, 2*k*, 2*l*, 2*m*, 2*n*, 2*o*, and 2*p*, collectively referred to as grating couplers 2, electrical pads 15*a*, 15*b*, 15*c*, 15*d*, 15*e*, 15*f*, 15*g*, 15*h*, 15*i*, 15*j*, 15*k*, 15*l*, 15*m*, 15*n*, 15*o*, and 15*p* collectively referred to as electrical pads 15, electrical devices 16*a*, 16*b*, and 16*c*, collectively referred to as electrical devices 16, optical devices 17*a*, 17*b*, and 17*c*, collectively referred to as optical devices 17, and optoelectronic devices 18*a*, 18*b*, 18*c*, 18*d*, 18*e*, 18*f*, 18*g*, 18*h*, 18*i*, and 18*j*, collectively referred to as optoelectronic devices 18. Grating couplers 2 in FIG. 2 generally correspond to grating coupler 2 in FIG. 1, and may have any implementations and advantages described above.

Electrical probe card 9 interfaces with electrical pads 15 on semiconductor die 12 by electrical needles 11. Electrical needles 11 extrude from a bottom of electrical probe card 9, and connect to corresponding electrical pads 15 on top of semiconductor die 12. Electrical probe card 9 is used to test electrical devices 16 and optoelectronic devices 18 on semiconductor die 12. Electrical probe card 9 can be coupled to electrical test equipment (not shown in FIG. 2) for providing electrical signals to and receiving electrical signals from electrical needles 11. Electrical needles 11 in electrical probe card 9 provide the electrical signals to and receive the electrical signals from electrical pads 15 on semiconductor die 12. Electrical pads 15 provide the electrical signals to and receive the electrical signals from electrical devices 16 and optoelectronic devices 18.

For purposes of clarity, electrical probe card 9 is illustrated with dashed lines, and features other than electrical needles 11 are not illustrated. However, it noted that electrical probe card 9 can also include a printed circuit board (PCB), routings, mountings, and other features not illustrated in FIG. 2.

Optical probe card 10 interfaces with grating couplers 2 on semiconductor die 12 by optical fibers 1. Optical fibers 1 extrude from a bottom of optical probe card 10, and couple to corresponding grating couplers 2 on top of semiconductor die 12. Optical probe card 10 is used to test optical devices 17 and optoelectronic devices 18 on semiconductor die 12. Optical probe card 10 can be coupled to optical test equipment (not shown in FIG. 2) for providing optical signals to and receiving optical signals from optical fibers 1. Optical fibers 1 in optical probe card 10 provide the optical signals to and receive the optical signals from grating couplers 2 on semiconductor die 12. Grating couplers 2 provide the optical signals to and receive the optical signals from optical devices 17 and optoelectronic devices 18.

For purposes of clarity, optical probe card 10 is illustrated with dashed lines, and features other than optical fibers 1 are not illustrated. However, it noted that optical probe card 10 can also include a PCB, routings, mountings, and other features not illustrated in FIG. 2.

Electrical devices 16, optical devices 17, and optoelectronic devices 18 reside in semiconductor die 12 in device area 14. Electrical devices 16, optical devices 17, and optoelectronic devices 18 represent devices under test by test system 8. Electrical devices 16 are devices having electrical input/output terminals. In various implementations, electrical devices 16 can be active electrical devices, such as transistors, passive electrical devices, such as resistors, or any other type of electrical devices. Optical devices 17 are devices having optical input/output terminals. In various implementations, optical devices 17 can be waveguides, interferometers, or any other type of optical devices. Optoelectronic devices 18 are devices having both electrical and optical input/output terminals. In various implementations, optoelectronic devices 18 can be photo diodes, optoelectronic modulators, or any other type of optoelectronic devices. In the present implementation, electrical devices 16, optical devices 17, and optoelectronic devices 18 each have two input/output terminals. In various implementations, electrical devices 16, optical devices 17, and optoelectronic devices 18 can have more or fewer input/output terminals. In various implementations, semiconductor die 12 can include more or fewer electrical devices 16, optical devices 17, and optoelectronic devices 18 than shown in FIG. 2.

Grating couplers 2 and electrical pads 15 reside in semiconductor die in scribe line 13 on the periphery of device area 14. Grating couplers 2 are coupled to optical devices 17 and to optoelectronic devices 18. Specifically, grating coupler 2*a* is coupled to optoelectronic device 18*a*. Grating coupler 2*b* is coupled to optoelectronic device 18*b*. Grating coupler 2*c* is coupled to optoelectronic device 18*c*. Grating coupler 2*d* is coupled to optoelectronic device 18*d*. Grating coupler 2*e* is coupled to optoelectronic device 18*e*. Grating couplers 2*f* and 2*g* are coupled to optical device 17*a*. Grating couplers 2*h* and 2*i* are coupled to optical device 17*b*. Grating couplers 2*j* and 2*k* are coupled to optical device 17*c*. Grating coupler 2*l* is coupled to optoelectronic device 18*f*. Grating coupler 2*m* is coupled to optoelectronic device 18*g*. Grating coupler 2*n* is coupled to optoelectronic device 18*h*. Grating coupler 2*o* is coupled to optoelectronic device 18*i*. And grating coupler 2*p* is coupled to optoelectronic device 18*j*. In one implementation, grating couplers 2 are coupled to optical devices 17 and optoelectronic devices 18 using a photonic waveguide. In various implementations, semiconductor die 12 can include more or fewer grating couplers 2 than shown in FIG. 2.

Electrical pads 15 are coupled to electrical devices 16 and to optoelectronic devices 18. Specifically, electrical pad 15*a* is coupled to optoelectronic device 18*a*. Electrical pad 15*b* is coupled to optoelectronic device 18*b*. Electrical pad 15*c* is coupled to optoelectronic device 18*c*. Electrical pad 15*d* is coupled to optoelectronic device 18*d*. Electrical pad 15*e* is coupled to optoelectronic device 18*e*. Electrical pads 15*f* and 15*g* are coupled to electrical device 16*a*. Electrical pads 15*h* and 15*i* are coupled to electrical device 16*b*. Electrical pads 15*j* and 15*k* are coupled to electrical device 16*c*. Electrical pad 15*l* is coupled to optoelectronic device 18*f*. Electrical pad 15*m* is coupled to optoelectronic device 18*g*. Electrical pad 15*n* is coupled to optoelectronic device 18*h*. Electrical pad 15*o* is coupled to optoelectronic device 18*i*. And electrical pad 15*p* is coupled to optoelectronic device 18*j*. In one implementation, electrical pads 15 are coupled to electrical devices 16 and optoelectronic devices 18 using vias and routing interconnects. In various implementations, semiconductor die 12 can include more or fewer electrical pads 15 than shown in FIG. 2.

Notably, test system 8 in FIG. 2 utilizes two probe cards, electrical probe card 9 and optical probe card 10. In order to test optoelectronic devices 18, both electrical probe card 9 and optical probe card 10 need to be aligned over semiconductor die 12. The alignment must be precise to successfully interface with electrical pads 15 and grating couplers 2. Otherwise, electrical probe card 9 and optical probe card 10 could damage semiconductor die 12, or interface with different semiconductors dies on a wafer. Aligning both electrical probe card 9 and optical probe card 10 typically requires an additional alignment step and additional alignment equipment, compared to a semiconductor die having only electrical devices or only optical devices. The alignment is further complicated because electrical probe card 9 and optical probe card 10, which are typically much larger than semiconductor die 12, must come close enough to semiconductor die 12 for both to interface with the die, but also must avoid crossing and crashing into each other.

In the approach shown in FIG. 2, in order to simplify alignment of electrical probe card 9 and optical probe card 10, electrical pads 15 are co-located with each other on semiconductor die 12, and grating couplers 2 are co-located with each other on semiconductor die 12. In particular, electrical pads 15 are co-located with each other on a first half of scribe line 13, while grating couplers 2 are co-located with each other on a second half of scribe line 13. This way, electrical probe card 9 can approach from a first direction to align over electrical pads 15, while optical probe card 10 can approach from an opposing second direction to align over grating couplers 2. In other approaches, grating couplers 2 are situated on top of semiconductor die 12, while electrical pads 15 are situated on bottom of semiconductor die 12, and a test system capable of aligning probe cards on both the top and bottom of a die can be used to align electrical probe card 9 and optical probe card 10. Regardless of any simplification technique used, it is understood that using multiple probe cards inherently increases the complexity of test system 8.

Because electrical pads 15 are co-located with each other and grating couplers 2 are co-located with each other, the versatility of semiconductor die 12 is limited. Electrical devices 16 can be situated on a first half of device area 14 near electrical pads 15, and optical devices 17 can be situated on a second half of device area near grating couplers 2. The arrangement of optoelectronic devices 18 is more complicated. Each optoelectronic device 18 needs to couple to an electrical pad 15 and to a grating coupler 2. In some implementations, each optoelectronic device 18 may need to couple to more than one electrical pad 15 and to more than one grating coupler 2. However, electrical pads 15 and grating couplers 2 are located on opposing halves of semiconductor die 12.

In the approach of FIG. 2, optoelectronic devices 18a and 18j are situated near the interface of the two halves, and easily coupled to electrical pads 15a and 15p respectively and grating couplers 2a and 2p respectively. Optoelectronic devices 18b, 18c, 18d, 18e, 18f, 18g, 18h, and 18i are situated at increasing distances from the interface, adjacent to their corresponding grating couplers 2. These increasing distances increase the length of electrical connectors used to couple optoelectronic devices 18b, 18c, 18d, 18e, 18f, 18g, 18h, and 18i to their corresponding electrical pads 15, increasing routing complexity, and resulting in optoelectronic devices 18 experiencing uneven losses during testing. Moreover, optoelectronic devices 18 are all situated on the same half of device area 14, resulting in unused die space, and potentially limiting available fabrication techniques to reduce die size, solely due to limitations of probe cards and test system 8.

In various implementations, other arrangements of optoelectronic devices 18 and techniques of coupling them to corresponding electrical pads 15 and grating couplers 2 can be employed. For example, optoelectronic devices 18 can be situated farther from grating couplers 2 and nearer to electrical pads 15. However, increased lengths of optical connectors typically result in more significant losses than increased lengths of electrical connectors. Regardless of any arrangement used, it is understood that the co-location of electrical pads 15 and the co-location of grating couplers 2 results in tradeoffs in routing complexity, losses, die use, and/or fabrication options, and inherently limits versatility of test system 8.

FIG. 3A illustrates a portion of a test system for optical, electrical, and optoelectronic devices according to one implementation of the present application. Test system 20 includes integrated optical/electrical probe card 21 and semiconductor die 24. Integrated optical/electrical probe card 21 includes optical fibers 22a, 22b, 22c, 22d, 22e, 22f, 22g, 22h, 22i, 22j, 22k, 22l, 22m, 22n, 22o, and 22p, collectively referred to as optical fibers 22, and electrical needles 23a, 23b, 23c, 23d, 23e, 23f, 23g, 23l, 23i, 23j, 23k, 23l, 23m, 23n, 23o, and 23p, collectively referred to as electrical needles 23. Semiconductor die 24 includes scribe line 25, device area 26, grating couplers 27a, 27b, 27c, 27d, 27e, 27f, 27g, 27h, 27i, 27j, 27k, 27l, 27m, 27n, 27o, and 27p, collectively referred to as grating couplers 27, electrical pads 28a, 28b, 28c, 28d, 28e, 28f, 28g, 28h, 28i, 28j, 28k, 28l, 28m, 28n, 28o, and 28p collectively referred to as electrical pads 28, electrical devices 29a, 29b, and 29c, collectively referred to as electrical devices 29, optical devices 30a, 30b, and 30c, collectively referred to as optical devices 30, and optoelectronic devices 31a, 31b, 31c, 31d, 31e, 31f, 31g, 31h, 31i, and 31j, collectively referred to as optoelectronic devices 31.

In contrast to electrical probe card 9 and optical probe card 10 in FIG. 2, integrated optical/electrical probe card 21 in FIG. 3A includes both optical fibers 22 and electrical needles 23. Optical fibers 22 are interspersed with electrical needles 23 in integrated optical/electrical probe card 21. Other than being interspersed in integrated optical/electrical probe card 21, optical fibers 22 and electrical needles 23 in FIG. 3A generally correspond to optical fibers 1 and electrical needles 11 in FIG. 2, and may have any implementations and advantages described above.

Integrated optical/electrical probe card 21 concurrently interfaces with both grating couplers 27 and electrical pads 28 on semiconductor die 24. Electrical needles 23 extrude from a bottom of integrated optical/electrical probe card 21, and connect to corresponding electrical pads 28 on top of semiconductor die 24. Optical fibers 22 extrude from a bottom of integrated optical/electrical probe card 21, and couple to corresponding grating couplers 27 on top of semiconductor die 24. In various implementations, rather than having four lines of optical fibers 22 and electrical needles 23 in the square pattern shown in FIG. 3A, integrated optical/electrical probe card 21 can have a single line of optical fibers 22 and electrical needles 23, or any number of lines of optical fibers 22 and electrical needles 23 in any pattern.

For purposes of clarity, integrated optical/electrical probe card 21 is illustrated with dashed lines, and features other than optical fibers 22 and electrical needles 23 are not illustrated. However, it noted that integrated optical/electrical probe card 21 can also include a PCB, routings, mountings, and other features not illustrated in FIG. 3A.

Integrated optical/electrical probe card 21 is used to concurrently test electrical devices 29, optical devices 30, and optoelectronic devices 31 on semiconductor die 24. Integrated optical/electrical probe card 21 can be coupled to electrical test equipment (not shown in FIG. 3A) for providing electrical signals to and receiving electrical signals from electrical needles 23, and to optical test equipment (not shown in FIG. 3A) for providing optical signals to and receiving optical signals from optical fibers 1. Electrical needles 23 in integrated optical/electrical probe card 21 provide the electrical signals to and receive the electrical signals from electrical pads 28 on semiconductor die 24. Electrical pads 28 provide the electrical signals to and receive the electrical signals from electrical devices 29 and optoelectronic devices 31. Optical fibers 22 in integrated optical/electrical probe card 21 provide the optical signals to and receive the optical signals from grating couplers 27 on semiconductor die 24. Grating couplers 27 provide the optical signals to and receive the optical signals from optical devices 30 and optoelectronic devices 31.

In contrast to semiconductor die 12 in FIG. 2, semiconductor die 24 in FIG. 3A includes grating couplers 27 interspersed with electrical pads 28. In the present implementation, grating couplers 27 are interspersed with electrical pads 28 in substantially single lines. For example, grating couplers 27e, 27f, 27g, and 27h and electrical pads 28e, 28f, 28g, and 28h are interspersed in substantially line B-B. Other than being interspersed in substantially single lines in semiconductor die 24, grating couplers 27 and electrical pads 28 in FIG. 3A generally correspond to grating couplers 2 and electrical pads 15 in FIG. 2, and may have any implementations and advantages described above.

Grating couplers 27 and electrical pads 28 reside in semiconductor die 24 in scribe line 25 on the periphery of device area 26. Electrical pads 28 are coupled to electrical devices 29 and to optoelectronic devices 31. Grating couplers 27 are coupled to optical devices 30 and to optoelectronic devices 31. Specifically, grating coupler 27a and electrical pad 28a are coupled to optoelectronic device 31a. Grating coupler 27b and electrical pad 28b are coupled to optoelectronic device 31b. Grating coupler 27c and electrical pad 28c are coupled to optoelectronic device 31c. Grating coupler 27d and electrical pad 28d are coupled to optoelectronic device 31d. Grating couplers 27e and 27f are coupled to optical device 30a. Grating coupler 27g and electrical pad 28e are coupled to optoelectronic device 31e. Electrical pads 28f and 28g are coupled to electrical device 29a. Grating coupler 27h and electrical pad 28h are coupled to optoelectronic device 31f. Grating couplers 27i and 27j are coupled to optical device 30b. Grating coupler 27k and electrical pad 28i are coupled to optoelectronic device 31g. Grating coupler 27l and electrical pad 28j are coupled to optoelectronic device 31h. Grating coupler 27m and electrical pad 28k are coupled to optoelectronic device 31i. Electrical pads 28l and 28m are coupled to electrical device 29b. Grating couplers 27n and 27o are coupled to optical device 30c. Grating coupler 27p and electrical pad 28n are coupled to optoelectronic device 31j. Electrical pads 28o and 28p are coupled to electrical device 29c.

As described above, electrical devices 29, optical devices 30, and optoelectronic devices 31 represent devices under test by test system 20. In various implementations, electrical devices 29 can be active electrical devices, such as transistors, passive electrical devices, such as resistors, or any other type of electrical devices. In various implementations, optical devices 30 can be waveguides, interferometers, or any other type of optical devices. In various implementations, optoelectronic devices 31 can be photo diodes, optoelectronic modulators, or any other type of optoelectronic devices. Electrical devices 29, optical devices 30, and optoelectronic devices 31 in FIG. 3A generally correspond to electrical devices 16, optical devices 17, and optoelectronic devices 18 in FIG. 2.

In various implementations, semiconductor die 24 can include more or fewer grating couplers 27, electrical pads 28, electrical devices 29, optical devices 30, and/or optoelectronic devices 31 than shown in FIG. 3A. In various implementations, grating couplers 27, electrical pads 28, electrical devices 29, optical devices 30, and/or optoelectronic devices 31 can be arranged in a manner other than shown in FIG. 3A. In various implementations, grating couplers 27 and electrical pads 28 can be coupled to electrical devices 29, optical devices 30, and/or optoelectronic devices 31 in a manner other than shown in FIG. 2. In various implementations, grating couplers 27 and electrical pads 28 can reside somewhere other than scribe line 25 in semiconductor die 24. In various implementations, semiconductor die 24 can have a shape other than a square.

Notably, the exemplary test system 8 in FIG. 2 and the exemplary test system 20 in FIG. 3A have the same number of devices (i.e., three electrical devices, three optical devices, and ten optoelectronic devices). However, test system 20 in FIG. 3A provides several advantages. First, because grating couplers 27 and electrical pads 28 are interspersed, the versatility of semiconductor die 24 is improved. Electrical devices 29, optical devices 30, and optoelectronic devices 31 can be situated anywhere in device area 26, while the grating couplers 27 and/or electrical pads 28 can be situated in scribe line 25 so as to maintain proximity to the devices they couple to. For example, in the present implementation, all optoelectronic devices 31 are situated near and easily coupled to their respective grating couplers 27 and respective electrical pads 28. In general, optoelectronic devices 31 do not need increased lengths of optical connectors or electrical connectors, reducing routing complexity, and resulting in optoelectronic devices 31 experiencing minimal and substantially uniform connector losses during testing. Moreover, optoelectronic devices 31 are all situated throughout device area 26, resulting in better use of die space, and allowing available fabrication techniques to reduce die size or increase device density in the die.

Second, by intersperging grating couplers 27 with electrical pads 28 in substantially single lines, such as in line B-B, optical fibers 22 and electrical needles 23 in integrated optical/electrical probe card 21 can readily be aligned to grating couplers 27 and electrical pads 28 in semiconductor die 24. Thus, test system 20 increases accuracy during alignment of integrated optical/electrical probe card 21 and semiconductor die 24. The alignment of optical fibers 22 and electrical needles 23 to grating couplers 27 and electrical pads 28 is described further below.

Third, test system 20 in FIG. 3A utilizes a single integrated optical/electrical probe card 21. Electrical devices 29, optical devices 30, and optoelectronic devices 31 in semiconductor die 24 can be tested concurrently using a single probe card, rather than using two probe cards, one dedicated to electrical interfaces and one dedicated to optical interfaces. Integrated optical/electrical probe card 21 can interface with advantageously interspersed grating couplers 27 and electrical pads 28 using interspersed optical fibers 22 and electrical needles 23. Also, in contrast to test system 8 in FIG. 2, test system 20 in FIG. 3A can couple both optical fibers 22 and electrical needles 23 to electrical devices 29, optical devices 30, and optoelectronic devices 31 utilizing a single alignment step.

FIG. 3B illustrates a cross-sectional view of a portion of a test system for optical, electrical, and optoelectronic devices according to one implementation of the present application. FIG. 3B represents a cross-sectional view along line "B-B" in FIG. 3A. As shown in FIG. 3B, integrated optical/electrical probe card 21 is situated over semiconductor die 24. Grating couplers 27e, 27f, 27g, and 27h are interspersed with electrical pads 28e, 28f, 28g, and 28h in semiconductor die 24. Optical fibers 22e, 22f, 22g, and 22h are interspersed with electrical needles 23e, 23f, 23g, and 23h in integrated optical/electrical probe card 21.

Integrated optical/electrical probe card 21 is aligned such that optical fibers 22e, 22f, 22g, and 22h interface with grating couplers 27e, 27f, 27g, and 27h, and electrical needles 23e, 23f, 23g, and 23h interface with electrical pads 28e, 28f, 28g, and 28h. As described above, grating couplers 27e, 27f, 27g, and 27h provide light between optical fibers 22e, 22f, 22g, and 22h and optical devices and optoelectronic devices (shown in FIG. 3A) in semiconductor die 24, while electrical pads 28e, 28f, 28g, and 28h provide light between electrical needles 23e, 23f, 23g, and 23h and optical devices and optoelectronic devices (shown in FIG. 3A) in semiconductor die 24.

In FIG. 3B, optical fibers 22 in integrated optical/electrical probe card 21 are aligned with grating couplers 27 in semiconductor die 23. Similarly, electrical needles 23 in integrated optical/electrical probe card 21 are aligned with electrical pads 28 in semiconductor die 24. Thus, the spacing of between an optical fiber 22 or electrical needle 23 and its adjacent optical fiber 22 or electrical needle 23 matches the spacing between a grating coupler 27 or electrical pad 28 and its adjacent grating coupler 27 or electrical pad 28. For example, optical fiber 22h and electrical needle 23h are spaced apart by distance D1, and corresponding grating coupler 27h and electrical pad 28h are also spaced apart by distance D1.

In one implementation, integrated optical/electrical probe card 21 is configured to individually tilt optical fibers 22 to angle θ (shown in FIG. 1). For example, each optical fiber 22 can be surrounded by a piezo-tube actuator that deflects in response to control signals applied to its electrodes. As another example, each optical fiber 22 can be tilted by a mechanical screw balance that is automated using feedback control. As described above, angle θ (shown in FIG. 1) varies based on the designs of grating couplers 27. Incorporating tilt control enables integrated optical/electrical probe card 21 to interface with various designs of grating couplers 27 on the same wafer without creating a new probe card, to perform fine alignments of optical fibers 22 after coarse alignment of integrated optical/electrical probe card 21, and to scan optical fibers 22 during test initialization and/or actual testing of semiconductor die 24.

FIG. 3C illustrates a test system for optical, electrical, and optoelectronic devices according to one implementation of the present application. Test system 20 in FIG. 3C includes integrated optical/electrical probe card 21, semiconductor wafer 33, fibers 34, fiber bundle 35, optical test equipment 36, wires 37, wire bundle 38, and electrical test equipment 39. Semiconductor die 24 of semiconductor wafer 33, as well as optical fibers 22 and electrical needles 23 of integrated optical/electrical probe card 21, are illustrated with dashed lines as seen through various structures of integrated optical/electrical probe card 21. Semiconductor die 24 in FIG. 3C generally corresponds to semiconductor die 24 in FIG. 3A, and may have any implementations and advantages described above.

Optical test equipment 36 can include a laser and a photodetector, or other means for providing and detecting light. Electrical test equipment 39 can include a signal generator and a voltmeter, or other means for providing and detecting electrical signals. Test system 20 uses optical test equipment 36 and electrical test equipment 39 to run tests on electrical, optical, and optoelectronic devices in semiconductor wafer 33. For example, it may be desirable to test gains of amplifiers, insertion losses of waveguides, and/or the spectral responses of photo diodes in semiconductor wafer 33. Optical test equipment 36 and electrical test equipment 39 can include memory elements for recording test data, software for analyzing test data, and displays or other means for outputting test data. In one implementation, optical test equipment 36 and electrical test equipment 39 are integrated as one machine.

Optical test equipment 36 and electrical test equipment 39 are connected to fiber bundle 35 and wire bundle 38 respectively. Fibers 34 connect fiber bundle 35 to integrated optical/electrical probe card 21. Similarly, wires 37 connect wire bundle 38 to integrated optical/electrical probe card 21. Fibers 34 connect to optical fibers 22 in integrated optical/electrical probe card 21. Similarly, wires 37 connect to electrical needles 23 in integrated optical/electrical probe card 21. Thus, optical fibers 22 in integrated optical/electrical probe card 21 are connected to optical test equipment 36 through fiber bundle 35. Similarly, electrical needles 23 in integrated optical/electrical probe card 21 are connected to electrical test equipment 39 through wire bundle 38.

For purposes of clarity, specific means of connecting fibers 34 to optical fibers 22 and connecting wires 37 to electrical needles 23 are not illustrated in FIG. 3C. However, integrated optical/electrical probe card 21 can use any means of connection known in the art. Moreover, although fibers 34 and wires 37 are illustrated on one side of integrated optical/electrical probe card 21, it is understood that fibers 34 and wires 37 can connect to integrated optical/electrical probe card 21 on any other side, including a top side. In one implementation, fiber bundle 35 and wire bundle 38 connect directly to integrated optical/electrical probe card 21.

Semiconductor wafer 33 includes a plurality of semiconductor dies having optical, electrical, and optoelectronic devices, such as semiconductor die 24. In one implementation, semiconductor wafer 33 is a silicon wafer having a diameter of two hundred millimeter (200 mm). In various implementations, the number of semiconductor dies in semiconductor wafer 33 can range from approximately one hundred dies to approximately two hundred dies.

As shown in FIG. 3C, integrated optical/electrical probe card 21 is aligned with a semiconductor die 24. Integrated optical/electrical probe card 21 can be aligned over a semiconductor die 24 using any method known in the art. As described above, optical fibers 22 interface with grating couplers to provide light to/from optical devices and optoelectronic devices (shown in FIG. 3A) in semiconductor die 24, and electrical needles 23 interface with electrical pads to provide electrical signals to/from optical devices and optoelectronic devices (shown in FIG. 3A) in semiconductor die 24. Accordingly, test system 20 can test electrical, optical, and optoelectronic devices at the wafer-level using a single probe card.

Thus, various implementations of the present application achieve a system for wafer-level testing of optical, electrical, and optoelectronic devices having optical and electrical terminals, and utilize the inventive integrated optical/electrical probe card along with interspersed electrical pads and said grating couplers, to overcome the deficiencies in the art to significantly reduce probe card alignment complexities and the limitations they impose on the design of semiconductor dies. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A test system for concurrently testing electrical, optical, and optoelectronic devices residing in a semiconductor die, said test system comprising:
   an integrated optical/electrical probe card;
   electrical pads in said semiconductor die connected to said electrical device and to said optoelectronic device;
   grating couplers in said semiconductor die connected to said optical device and to said optoelectronic device;
   said electrical pads and said grating couplers being interspersed in substantially a single line in said semiconductor die;
   said integrated optical/electrical probe card interfacing with said electrical pads by electrical needles and interfacing with said grating couplers by optical fibers.

2. The test system of claim 1, wherein said optical fibers are interspersed with said electrical needles.

3. The test system of claim 1, wherein said optical fibers are connected to an optical test equipment through a fiber bundle and said electrical needles are connected to an electrical test equipment through a wire bundle.

4. The test system of claim 1, wherein one of said grating couplers provides light from one of said optical fibers of said integrated optical/electrical probe card to said optoelectronic device in said semiconductor die.

5. The test system of claim 1, wherein said optoelectronic device is selected from a photo diode and an optoelectronic modulator.

6. The test system of claim 1, wherein one of said grating couplers provides light from one of said optical fibers of said integrated optical/electrical probe card to said optical device in said semiconductor die.

7. The test system of claim 1, wherein said optical device is selected from a waveguide and an interferometer.

8. A method comprising:
   providing a semiconductor die including electrical pads and grating couplers, said electrical pads and said grating couplers being interspersed in substantially a single line in said semiconductor die;
   using an integrated optical/electrical probe card to couple electrical needles in said integrated optical/electrical probe card to an electrical device in said semiconductor die and to an optoelectronic device in said semiconductor die;
   concurrently using said integrated optical/electrical probe card to couple optical fibers in said integrated optical/ electrical probe card to an optical device in said semiconductor die and to said optoelectronic device.

9. The method of claim 8, wherein said electrical needles in said integrated optical/electrical probe card interface with said electrical pads in said semiconductor die, and wherein said optical fibers in said integrated optical/electrical probe card interface with said grating couplers in said semiconductor die.

10. The method of claim 8, wherein said optical fibers are interspersed with said electrical needles.

11. The method of claim 8, further comprising connecting said optical fibers to an optical test equipment through a fiber bundle and connecting said electrical needles to an electrical test equipment through a wire bundle.

12. The method of claim 8, wherein one of said grating couplers provides light from one of said optical fibers of said integrated optical/electrical probe card to said optoelectronic device in said semiconductor die.

13. The method of claim 8, wherein said optoelectronic device is selected from a photo diode and an optoelectronic modulator.

14. The method of claim 8, wherein one of said grating couplers provides light from one of said optical fibers of said integrated optical/electrical probe card to said optical device in said semiconductor die.

15. The method of claim 8, wherein said optical device is selected from a waveguide and an interferometer.

16. A semiconductor die comprising:
   an optoelectronic device;
   electrical pads, wherein a first electrical pad is connected to said optoelectronic device;
   grating couplers, wherein a first grating coupler is connected to said optoelectronic device;
   said electrical pads and said grating couplers being interspersed in substantially a single line in said semiconductor die, and being configured to interface with an integrated optical/electrical probe card.

17. The semiconductor die of claim 16, wherein said electrical pads are configured to interface with said integrated optical/electrical probe card by electrical needles and said grating couplers are configured to interface with said integrated optical/electrical probe card by optical fibers.

18. The semiconductor die of claim 16, wherein said optoelectronic device is selected from a photo diode and an optoelectronic modulator.

19. The semiconductor die of claim 16, further comprising an electrical device, wherein a second electrical pad is connected to said electrical device.

20. The semiconductor die of claim 16, further comprising an optical device, wherein a second grating coupler is connected to said optical device.

* * * * *